(12) United States Patent
Hack et al.

(10) Patent No.: US 8,764,255 B2
(45) Date of Patent: Jul. 1, 2014

(54) SEMI-RIGID ELECTRONIC DEVICE WITH A FLEXIBLE DISPLAY

(71) Applicants: Michael Hack, Princeton, NJ (US);
Emory Krall, Philadelphia, PA (US);
Ruiqing Ma, Morristown, NJ (US);
Prashant Mandlik, Lawrenceville, NJ (US)

(72) Inventors: Michael Hack, Princeton, NJ (US);
Emory Krall, Philadelphia, PA (US);
Ruiqing Ma, Morristown, NJ (US);
Prashant Mandlik, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/648,911

(22) Filed: Oct. 10, 2012

(65) Prior Publication Data

US 2014/0098549 A1    Apr. 10, 2014

(51) Int. Cl.
*F21S 8/08*     (2006.01)
*F21V 19/00*    (2006.01)
*F21V 21/00*    (2006.01)

(52) U.S. Cl.
USPC ........... 362/418; 362/382; 362/419; 362/420; 362/432

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,819,036 | B2 | 11/2004 | Cok et al. |
| 7,050,835 | B2 | 5/2006 | Hack et al. |
| 7,128,269 | B2 | 10/2006 | Silverbrook |

(Continued)

FOREIGN PATENT DOCUMENTS

| | | |
|---|---|---|
| WO | 2004047059 | 6/2004 |
| WO | 2006/038171 | 4/2006 |

(Continued)

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Natalie Walford
(74) *Attorney, Agent, or Firm* — Morris & Kamlay LLP

(57) ABSTRACT

A semi-rigid electronic device is disclosed that includes a flexible panel and a housing. The housing may have a physical dimension L, such as length, height, or a diagonal. The minimum bending device radius of the device along the dimension L may be L/pi when held at an edge. The bending radius increases the more rigid the device. The housing, electronic components, and display may each contribute to the flexibility of the overall device. The housing and/or the flexible panel may also include one or more ribs to constrain movement of the semi-rigid device.

27 Claims, 3 Drawing Sheets

(56) References Cited

U.S. PATENT DOCUMENTS

| | | |
|---|---|---|
| 7,180,665 B2 | 2/2007 | Daniel et al. |
| 7,192,157 B2 * | 3/2007 | Sloan et al. .................... 362/216 |
| 7,279,704 B2 | 10/2007 | Walters et al. |
| 7,368,307 B2 | 5/2008 | Cok |
| 7,371,970 B2 * | 5/2008 | Flammer et al. .............. 174/255 |
| 7,431,968 B1 | 10/2008 | Shtein et al. |
| 7,453,532 B2 * | 11/2008 | Kondo et al. ................... 349/58 |
| 7,558,057 B1 | 7/2009 | Naksen et al. |
| 7,884,815 B2 | 2/2011 | Fraser et al. |
| 7,968,146 B2 | 6/2011 | Wagner et al. |
| 8,005,518 B1 | 8/2011 | Birsel et al. |
| 8,027,163 B2 * | 9/2011 | Bang ............................. 361/704 |
| 8,096,068 B2 | 1/2012 | Van Rens |
| 8,434,909 B2 * | 5/2013 | Nichol et al. ............ 362/296.01 |
| 2003/0109286 A1 | 6/2003 | Hack et al. |
| 2003/0230980 A1 | 12/2003 | Forrest et al. |
| 2004/0174116 A1 | 9/2004 | Lu et al. |
| 2007/0080627 A1 * | 4/2007 | Sakamoto .................... 313/504 |
| 2008/0068288 A1 | 3/2008 | Henkel |
| 2011/0181494 A1 * | 7/2011 | Wong et al. .................... 345/1.3 |
| 2012/0038570 A1 | 2/2012 | Delaporte et al. |
| 2012/0287674 A1 * | 11/2012 | Nichol et al. ................. 362/611 |
| 2013/0044487 A1 | 2/2013 | Burrows et al. |

FOREIGN PATENT DOCUMENTS

| | | |
|---|---|---|
| WO | 2008057394 | 5/2008 |
| WO | 2009/067010 | 5/2009 |
| WO | 2010011390 | 1/2010 |

OTHER PUBLICATIONS

Baldo et al., "Very high-efficiency green organic light-emitting devices based on electrophosphorescence", Applied Physics Letter, vol. 75, No. 1, pp. 4-6, 1999.

* cited by examiner

SEMI-RIGID ELECTRONIC DEVICE WITH A FLEXIBLE DISPLAY

PRIORITY

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to semi-rigid devices having a flexible panel such as a flexible display or a flexible lighting panel.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

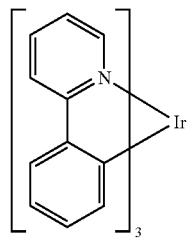

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment, a device is provided that includes a flexible panel, such as a display panel or a lighting panel, and a housing having a physical dimension L. The device may be semi-rigid, and the minimum bending device radius of the device may be L/pi when held at an edge of the device. The device may include a touch screen or an active matrix backplane. The flexible panel may be constructed from a flexible AMOLED or a flexible OLED. The flexible panel may include a substrate such as thin glass, metal foils such as stainless steel and aluminum, plastic films such as PET and PEN, and composite materials. The flexible panel may be configured to emit light from a concave surface of the device. The device may include a flexible circuit board within the housing to provide circuitry configured to control the flexible panel. A processor may execute an operating system and one or more applications. The housing may be constructed from a material such as rubber, silicon, plastic, metal (such as spring steel), paper, or a composite material.

The device may include one or more ribs that may maintain the device in a flat configuration in the absence of a force applied by the user. The ribs may be configurable from a first rib configuration that prevents the flexible display from flexing in at least one direction to a second rib configuration that allows the flexible display to flex in the at least one direction. The ribs are configured to receive a signal to convert from the first configuration of the second configuration. Examples of a signal include an electrical impulse, a tension at least at one end of the display, and a compression of at least one end of the display. Stiffening elements may be physically connected to the plurality of ribs which, when activated, maintain the plurality of ribs in the second rib configuration. Examples of stiffening elements include motorized rods, rotating pins, pneumatic bladders, and electromagnetics.

The device may be sufficiently rigid to maintain a substantially planar configuration in the absence of a force applied by the user when only a portion of the device is supported by a structure disposed under the device or when only about half of the device is supported by the structure. The device may maintain a constant curvature in the absence of a continual application of force by a user. The device may have a default non-zero curvature in the absence of a force applied by a user.

The largest surface area of the device may not be more than about 20% larger than the area of the flexible panel. The width of the device may not be more than about 2 mm larger than the width of the flexible panel. The height of the device may not be more than about 2 mm larger than the height of the flexible panel. The device may have a non-uniform thickness. In one configuration, the device may have a greater thickness at the edge than in the center of the device. At least a portion of the edge of the device may have a different degree of flexibility than a central portion of the device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
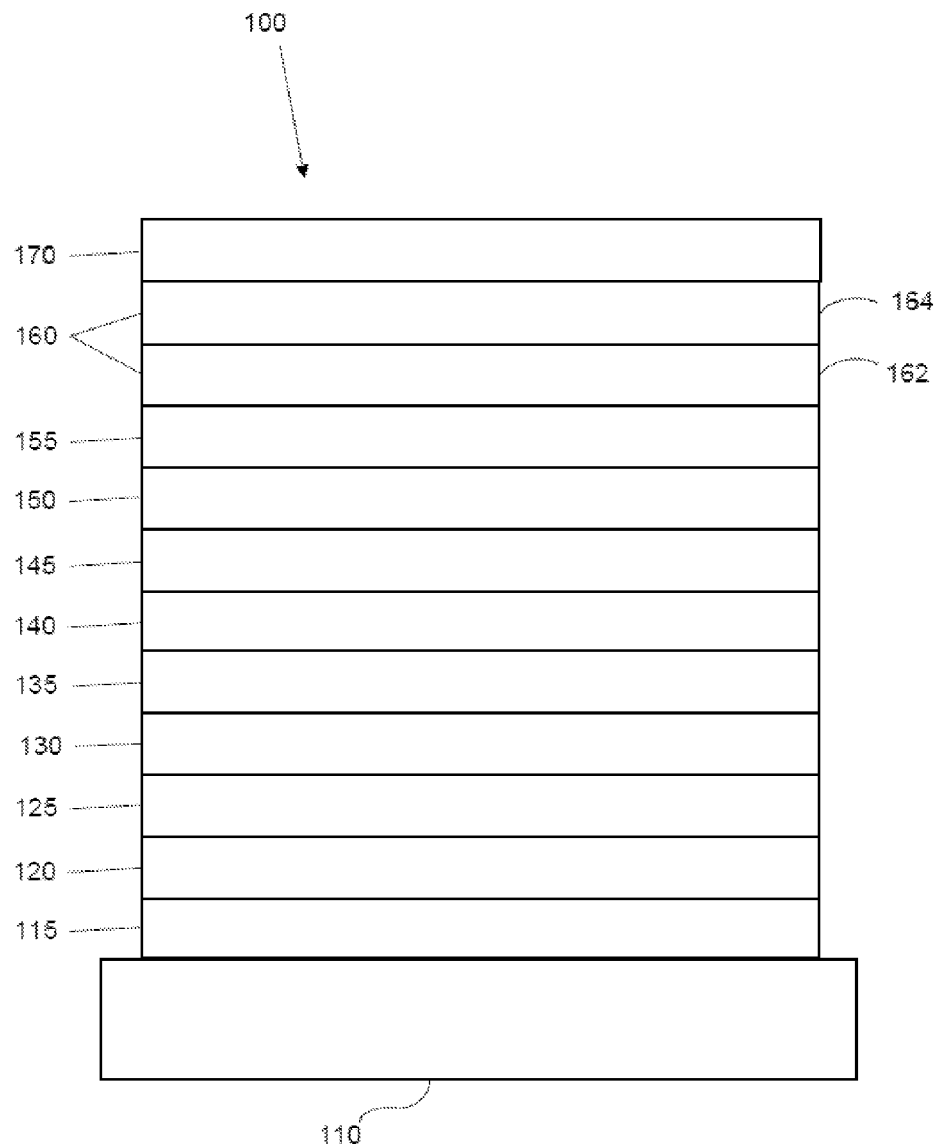
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
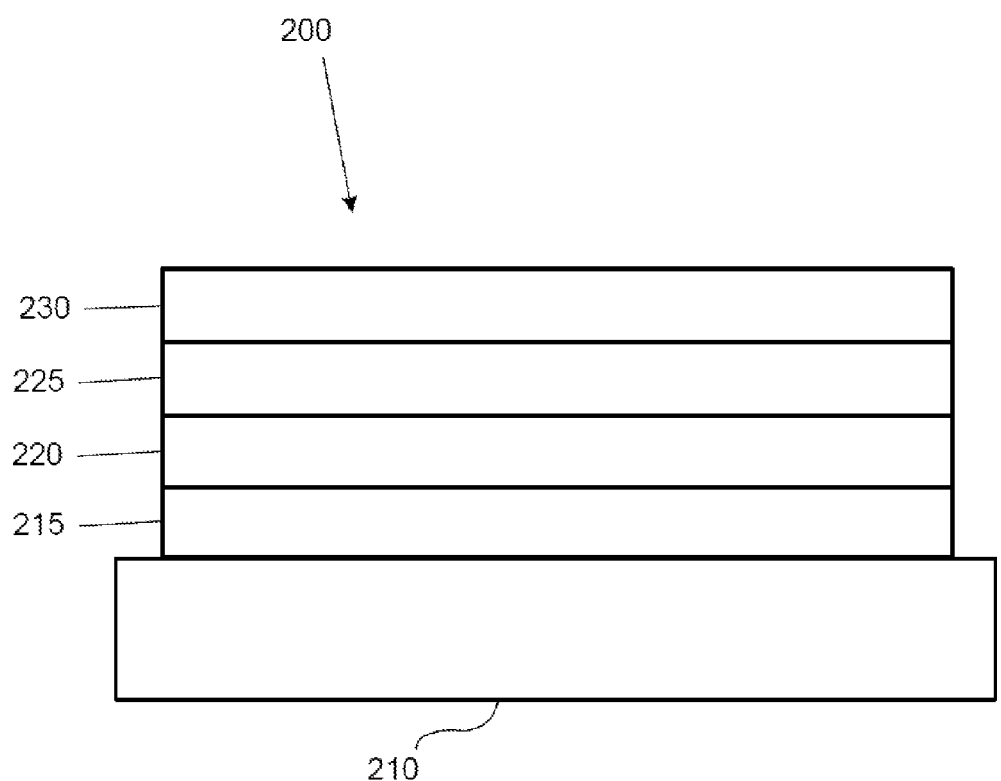
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

An organic light emitting device is provided. The device may include an anode, a cathode, and an organic emissive layer disposed between the anode and the cathode. The organic emissive layer may include a host and a phosphorescent dopant. OLEDs may be designed to be a component of a flexible display by altering the composition of the materials that make up the display compared to conventional rigid displays such as a LCD. An advantage of a flexible display is that it can be rolled or folded into more compact forms for storage, transportation, etc.

Thin film deposition processes can be used for depositing pixels onto a collapsible substrate to form a collapsible display. Preferably, the display may be fabricated on a flexible substrate, such as plastic or thin metal foil.

Active-matrix backplanes that are compatible with plastic substrates can be fabricated, and deposited onto the flexible substrate. The pixels can then be deposited thereon. Though active-matrix displays are preferred, it should be understood that passive-matrix displays can also be used in accordance with the principles of the invention. Active-matrix displays typically use transistors to keep their diodes in an on or off state. Passive-matrix displays, on the other hand, apply current to the diodes at a specific refresh rate to maintain an image.

OLED display technology may be desirable for use on such flexible substrates because of, among other reasons, its very low substrate temperature during deposition, as well as its high brightness at low power levels. Small molecule OLEDs can be used, such as described in U.S. Pat. No. 5,844,363, for example, which is incorporated herein by reference in its entirety. Encapsulation to prevent moisture and oxygen from permeating through the plastic films and degrading the OLED performance is also preferably provided, for example, such as disclosed on U.S. Pat. No. 5,771,562.

In an embodiment, a semi-rigid device is provided that includes a flexible panel and a housing having a physical dimension, L. The panel may include a display panel such as an emissive panel, an OLED, a reflective panel, or an LCD panel, or a lighting panel such as a general illumination device or the like. In some configurations, such as where the panel is a reflective panel, it may not itself directly be emissive, such as where it operates in conjunction with another component of the device, but may be seen to emit light by a user of the device. When a "display" is described herein, it will be understood that such description encompasses any such flexible panel unless specifically indicated otherwise. As used herein, a "semi-rigid" device is one that has some flexibility but is not completely flexible, i.e., when only a portion of the device is supported, the remainder of the device maintains a curvature more than that which would result for a device with no rigidity. One way to describe the rigidity of a device as disclosed herein is by the bending radius that results when the device is held or otherwise supported only at an edge of the device, where a smaller bending radius corresponds to a greater flexibility of the device. A device as disclosed herein may have a minimum bending radius of L/pi when it is held at an edge, where L is the outer physical dimension of the device in the direction in which the device is bent. A perfectly, completely rigid device has a bending radius of infinity when held at an edge; thus a semi-rigid device as disclosed herein may be described has having a bending radius of less than infinity. The dimension L of the device may refer to, for example, the length or width of a substantially rectangular device. A tablet-shaped device with a 25 cm length would have a bending radius between 25/pi and infinity when flexed along the length. In some configurations, the bending radius of a device may range between L/pi and 100 L/pi, L/pi and 500 L/pi, or L/pi and 1000 L/pi, along the outer physical dimension L of the device.

The flexible panel may include an active matrix backplane and may be constructed using an OLED, such as an AMOLED It may emit light from a concave or convex surface when the device is held or arranged in a non-planar configuration, such as by applying a force to the device, supporting only a portion of the device, or the like. In general, the minimum bending radius of a device is primarily determined by the composition of materials used to construct the device. The flexible display may be constructed from a variety of substrates such as thin glass, metal foils such as stainless steel and aluminum, plastic films such as PET and PEN, and composite materials.

In an embodiment, the device may be sufficiently rigid to maintain a substantially planar configuration in the absence of a force applied by the user and when only a portion, such as a half, of the device is supported by a structure disposed under the device. For example, a tablet-sized version of the device may be resting on a table, with half of the device unsupported by the table. The unsupported portion of the device may substantially in the same plane as the portion of it that is supported by the table. In some configurations, the unsupported portion may curve downward to a relatively small degree, though still remaining in essentially the same plane as the supported portion of the device. For example, the unsupported portion of the device may bend downward such that the top-most surface of the unsupported portion of the device is adjacent to the supported bottom-most surface of the device.

Figure 3:
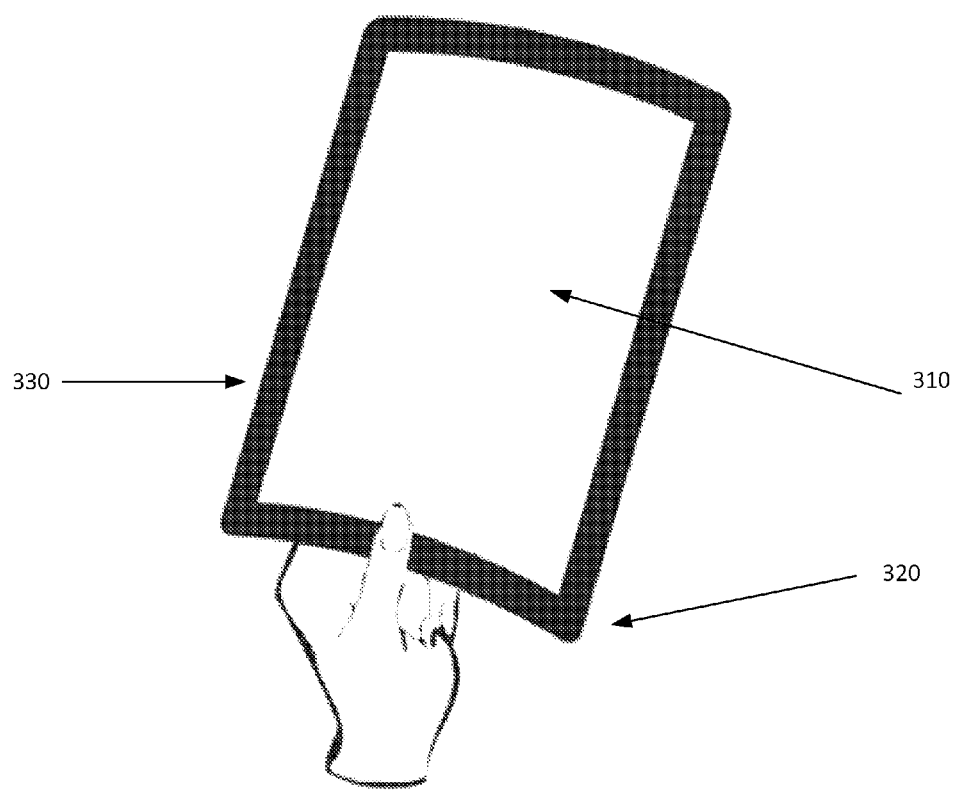
FIG. 3 is an example of a semi-rigid flexible display device.

An example of a semi-rigid device is provided in FIG. 3. The flexible panel 310 is bound by an edge 330 indicated in black. A hand is shown supporting the device at the midpoint of its width causing the device to flex the light emitting display in a convex manner. The frame and display appear curved 320 along a vertical-length axis from the bottom of the display, i.e., where the hand is located, to the top of the display.

In an embodiment, the device may maintain a constant curvature in the absence of a continual application of force by a user. As a specific example, the device may have a default non-zero curvature in the absence of a force applied by a user. That is, if the entire device is supported by a table, it may have some degree of curvature. A default curvature of the device may allow it to flex in the pre-defined curved direction. Consequently, if the device were dropped, it may be capable of absorbing the shock from being dropped or hitting a solid object more readily than a conventional rigid display device. The default curvature may allow the device to be more likely to land in a way that allows the device to absorb the force of impact by flexing an additional amount in the same direction as the pre-defined curvature.

A flexible panel may be flexed or have a bending radius in any direction. In some configurations the bending radius may be constrained in one or more directions by a housing. For example, a substantially rectangular tablet may have a flexible panel on a top side, and dimensions of about 24 cm in height, about 18 cm in length. If the user holds the device with a single hand at the edge along the 18 cm length, similar to how one would hold a sheet of paper to view one side, the device may flex in a concave manner along the height axis of the device if the user curves the edge of the display in a like manner. If the user fails to flex the edge upward, the light emitting display may bend in a convex manner along the length axis of the device. The degree of bending may vary along the length of an axis. For example, when the display is flexed in a concave shape, the bending radius along the length axis may decrease the closer to the area where the user is holding the device. Thus, at 1 cm from the hand position, the bending radius may be 10 cm, and at 15 cm from the hand the bending radius may be 30 cm. The bending radius of the display in a particular arrangement may be determined in part by the position of support, that is, where the device is held. It may also be determined by how the device is supported, such as with one or two hands and how each hand flexes or places a force on the display.

As used herein, the "edge" of a device includes any and all points within a specified distance of the physical edge of the device, typically the outermost 1-5% of the device. Thus, for example, a rectangular device having a largest surface area of about 400 $cm^2$ may be said to have an "edge" region of 4-20 $cm^2$, disposed around the outermost portion of the surface. The "edge" region may be distributed evenly around each edge of the device, or it may be defined proportionally relative to the other dimensions of the device. For example, a 4:3 ratio display may have an "edge" region in the same 4:3 ratio, with the total area of the edge region(s) being 1-5% of the total surface area of that surface of the device. In some configurations, the "edge" of the device will be defined by the extent of the physical housing disposed around the outermost portion of the device, and/or the portion of the device which is non-emissive.

The edge region of a device may not have a uniform thickness around the entire device. For example, the left and right sides of the device may have a narrower edge than the top and bottom sides. Differences in edge thickness may be useful to implement different flexibilities along different axes of the device, to store various electronic components, for aesthetic purposes, and the like. The edge of a device may be emissive, or it may not emit light in some configurations. For example, an OLED or other flexible panel may extend throughout the device and may emit through all or a portion of the edge region, or it may not extend or may not emit in the edge region.

At least a portion of the edge of the device may have a different degree of flexibility than a central portion of the device. As used herein, the "central portion" of a device refers to any and all points except those within the physical edge region of the device.

In an embodiment, a semi-rigid device includes a flexible circuit board disposed within the housing. The flexible circuit board may provide circuitry configured to control the flexible panel. For example, a display controller may be connected to a system bus that is connected to a processor. Display data may be transmitted to and from the display controller via the system bus to other circuitry contained in the device, such as the processor. When the semi-rigid device is a computing device such as a smartphone, tablet computer, or the like, it may further include a processor to execute an operating system and one or more applications. Similarly, semi-rigid device as disclosed herein may include various communication modules, such as cellular, wifi, Bluetooth, and the like. In some configurations, a rigid circuit board may also be attached to the display to limit the flexibility of the semi-rigid device to be within a desired range.

In an embodiment, the flexible panel may be touch sensitive, such as a touch-sensitive display. In some configurations, the device may be configured to distinguish between a touch intended to manipulate a user interface being displayed or otherwise provided by the semi-rigid device, and a "touch" resulting from a user applying force to the semi-rigid device to maintain the device in a desired configuration.

In an embodiment, the housing may act to constrain the flexibility of the device. The housing may be composed of materials such as rubber, silicon, plastic, metal (such as spring steel), paper, or a composite material. The housing may be utilized to form the edge portion of the screen. It may contain rigid or flexible electronics or a battery. For example, the housing may include many small, rigid parts separated far enough apart that the overall device is still flexible. The various rigid components may be adhered to the back of the flexible panel and entirely encapsulated by an overmolded flexible material. The electronics may be placed in areas of the device that are subject to less or lower stress such as the edge.

The housing may include of one or more ribs which may contain rigid or flexible electronics or a battery. The ribs may be configured to maintain the device in a flat configuration in the absence of a force applied by the user. The ribs may be configurable from a first rib configuration that prevents the flexible panel from flexing in at least one direction to a second rib configuration that allows the flexible panel to flex in the at least one direction. The ribs may receive a signal to convert from the first configuration to the second configuration. A signal may include an electrical impulse, a tension at least at one end of the display, and a compression of at least one end of the display. For example, a large movie screen may have ribs attached to it the back side of a flexible panel. In a first configuration, the screen may be completely flat. In a second configuration, the light emitting portion of the flexible panel may be formed, automatically or manually, into a concave shape to provide a user with a more immersive viewing experience. The ribs may receive a signal to lock them in a particular configuration. For example, the ribs may contain micro-switches that lock or hold each rib in its current configuration in response to the received signal. The ribs may be released by a signal, such as tension at an edge of the display, to position the ribs to the first configuration or a third configuration Stiffening elements may be physically connected to the ribs which, when activated, maintain the ribs in the second rib configuration. Stiffening elements may include an element type such as motorized rods, rotating pins, pneumatic bladders, and electromagnetics. The stiffening elements may be disposed between each pair of adjacent ribs in some configurations. For example, a zipper-like mechanism may turn stiffening elements such that they are changed from being positioned in-line with the ribs to being perpendicular to the ribs which causes the screen to be substantially less flexible in the direction of the stiffening elements. The arrangement of the stiffening elements may vary depending on the application. For example, the density of stiffening elements may be increased or the length of the stiffening elements may be altered.

The display, housing, and edge sizes of the device may vary. One or both of the width or height of the device may not be more than about 2 mm larger than the width of the flexible panel. For example, the device may have a flexible panel that has a framed edge of approximately 1 mm. The device may have a non-uniform thickness; for example, one end of the device may be thicker than the other. The device may have a greater thickness at the edge than in the center of the device. In some configurations, the largest surface area of the device may not be more than about 20% larger than the area of the flexible panel.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   a flexible panel; and
   a housing having a physical dimension L;
   wherein the device is semi-rigid, and the minimum bending device radius along the physical dimension L is L/pi when the device is held at an edge of the device; and
   wherein the flexible panel comprises a panel selected from the group consisting of: a display panel and a lighting panel.

2. The device as recited in claim 1, wherein the flexible panel comprises a display panel selected from the group consisting of: an emissive panel, a reflective panel, and an LCD.

3. The device as recited in claim 1, further comprising a flexible circuit board disposed within the housing, the flexible circuit board providing circuitry configured to control the flexible panel.

4. The device as recited in claim 3, further comprising a processor to execute an operating system and one or more applications.

5. The device as recited in claim 1, further comprising a plurality of ribs configured to maintain the device in a flat configuration in the absence of a force applied by the user.

6. The device as recited in claim 5, wherein the plurality or ribs are configurable from a first rib configuration that prevents the flexible panel from flexing in at least one direction to a second rib configuration that allows the flexible panel to flex in the at least one direction.

7. The device as recited in claim 5, further comprising a plurality of stiffening elements physically connected to the plurality of ribs which, when activated, maintain the plurality of ribs in the second rib configuration.

8. The device as recited in claim 1, wherein the device is sufficiently rigid to maintain a substantially planar configuration in the absence of a force applied by the user, when only a portion of the device is supported by a structure disposed under the device.

9. The device as recited in claim 1, wherein the device maintains a constant curvature in the absence of a continual application of force by a user.

10. The device as recited in claim 1, wherein the device is sufficiently rigid to maintain a substantially planar configuration in the absence of a force applied by the user, when only about half the device is supported by the structure.

11. The device as recited in claim 1, wherein the flexible panel comprises a flexible AMOLED.

12. The device as recited in claim 1, wherein the flexible panel comprises a flexible OLED.

13. The device as recited in claim 1, wherein the device has a default non-zero curvature in the absence of a force applied by a user.

14. The device as recited in claim 11, wherein the flexible panel is configured to emit light from a concave surface of the device.

15. The device as recited in claim 1, wherein the largest surface area of the device is not more than about 20% larger than the area of the flexible panel.

16. The device as recited in claim 1, wherein the width of the device is not more than about 2 mm larger than the width of the flexible panel.

17. The device as recited in claim 1, wherein the height of the device is not more than about 2 mm larger than the height of the flexible panel.

18. The device as recited in claim 1, further comprising a touch screen.

19. The device as recited in claim 1, wherein the device has a non-uniform thickness.

20. The device as recited in claim 19, wherein the device has a greater thickness at the edge than in the center of the device.

21. The device as recited in claim 1, wherein at least a portion of the edge of the device has a different degree of flexibility than a central portion of the device.

22. The device as recited in claim 1, wherein the housing comprises a material selected from the group consisting of: thin glass, metal foils such as stainless steel and aluminum, plastic films such as PET and PEN, and composite materials.

23. The device as recited in claim 1, wherein the flexible panel comprises a substrate selected from the group consisting of: rubber, silicon, plastic, metal (such as spring steel), paper, or a composite material.

24. The device as recited in claim 1, wherein the bending radius of the device is in the range between L/pi and 1000 L/pi.

25. The device as recited in claim 1, wherein the bending radius of the device is in the range between L/pi and 100 L/pi.

26. The device as recited in claim 1, wherein L is the largest outer physical dimension of the device.

27. The device as recited in claim 1, wherein the device comprises an active matrix backplane.

* * * * *